(12) United States Patent
Lee

(10) Patent No.: US 11,799,477 B2
(45) Date of Patent: Oct. 24, 2023

(54) MAGNETIC CONTROL SWITCH

(71) Applicant: EATON INTELLIGENT POWER LIMITED, Dublin (IE)

(72) Inventor: Davin R. Lee, Watertown, WI (US)

(73) Assignee: EATON INTELLIGENT POWER LIMITED, Dublin (IE)

(*) Notice: Subject to any disclaimer, the term of this patent is extended or adjusted under 35 U.S.C. 154(b) by 194 days.

(21) Appl. No.: 17/416,972

(22) PCT Filed: Dec. 20, 2019

(86) PCT No.: PCT/EP2019/025480
§ 371 (c)(1),
(2) Date: Jun. 21, 2021

(87) PCT Pub. No.: WO2020/126103
PCT Pub. Date: Jun. 25, 2020

(65) Prior Publication Data
US 2022/0085809 A1    Mar. 17, 2022

Related U.S. Application Data

(60) Provisional application No. 62/783,262, filed on Dec. 21, 2018.

(51) Int. Cl.
*H03K 17/97* (2006.01)
*H01H 23/28* (2006.01)

(52) U.S. Cl.
CPC ............. *H03K 17/97* (2013.01); *H01H 23/28* (2013.01)

(58) Field of Classification Search
CPC ......... H03K 17/97; H01H 23/28; H01H 23/30
See application file for complete search history.

(56) References Cited

U.S. PATENT DOCUMENTS

| 4,868,530 A * | 9/1989 | Ahs ................. G05G 5/05 335/207 |
| 6,501,458 B2 * | 12/2002 | Baker .............. G06F 3/033 345/161 |

(Continued)

FOREIGN PATENT DOCUMENTS

| EP | 3107211 | 12/2016 |
| WO | 2013173286 | 11/2013 |

OTHER PUBLICATIONS

International Search Report and Written Opinion; Corresponding PCT Application No. PCT/EP2019/025480; dated Mar. 31, 2020.

*Primary Examiner* — Bernard Rojas
(74) *Attorney, Agent, or Firm* — Squire Patton Boggs (US) LLP

(57) ABSTRACT

A rocker switch includes a rocker switch housing and a first magnet sensor. The rocker switch further includes a button rotatably mounted to the rocker switch housing about a first axis. The rocker switch also includes a magnet holder in contact with the button and rotatably mounted to the rocker switch housing about a second axis different from the first axis. The magnet holder holds a first magnet having a first polarity and a second magnet having a second polarity different from the first polarity. When the button is in a first button position, the button biases the magnet holder to a first magnet holder position, in which the first magnet is proximate to the magnet sensor. When the button is in a second button position, the button biases the magnet holder to a second magnet holder position, in which the second magnet is proximate to the magnet sensor.

18 Claims, 8 Drawing Sheets

(56) References Cited

U.S. PATENT DOCUMENTS

| | | | |
|---|---|---|---|
| 8,570,126 B1 | 10/2013 | Lee et al. | |
| 9,423,894 B2 * | 8/2016 | Olsson | G06F 3/0338 |
| 9,425,008 B1 | 8/2016 | Lee | |
| 9,558,898 B2 | 1/2017 | Lee | |
| 9,841,295 B2 | 12/2017 | Kernebeck | |
| 10,395,863 B2 * | 8/2019 | Levay | G05G 5/06 |
| 2008/0284549 A1 * | 11/2008 | Bedell | H03K 17/9502 335/170 |

* cited by examiner

MAGNETIC CONTROL SWITCH

FIELD OF INVENTION

The present disclosure relates to control switches. More particularly, the present disclosure relates to contactless control switches.

BACKGROUND

Electrical switches are used as control switches for a variety of applications in various industries. For example, in specialty vehicle markets, such as heavy trucks, agricultural equipment, and construction equipment, control switches are employed to control the motor vehicle lighting, the windshield wipers, the rear windshield heating, the cruise control functions, the internal central locking and other functions on and off. The control switches may be in the form of rocker switches that may be pushed by an operator to rotate or tilt from a neutral position (i.e., switched-off state) to one or more activated positions (i.e., a switched-on state) that control operation of an associated system or component.

One type of control switch is a contactless switch that operates by moving a magnet past a fixed magnetic sensor, such as a Hall effect IC or a magnetoresistive sensor, in order to control and determine the modes provided by the switch. In existing three-position contactless rocker switches, the switch may include two magnets and a single sensor. Such switches may be configured to move a positive magnet near the sensor when the switch is in a first position, move no magnet near the sensor when the switch is in a second position, and move a negative magnet near the sensor when the switch is in a third position. However, such switches may be susceptible to external magnetic fields. For example, when the switch is in the second position and no magnet is near the sensor, an external magnetic field may act upon the sensor. Thus, the sensor may falsely indicate that the switch is in a first position or a third position.

SUMMARY OF THE INVENTION

In one embodiment, a switch includes a switch housing and a printed circuit board mounted to the switch housing. The printed circuit board includes at least a first magnet sensor and a second magnet sensor. The switch further includes a button moveably mounted to the switch housing. The button is moveable between at least a first button position, a second button position, and a third button position. The switch also includes a magnet holder in contact with the button and moveably mounted to the switch housing. The magnet holder holds at least a first magnet having a first polarity, a second magnet having a second polarity different from the first polarity, a third magnet having the second polarity, and a fourth magnet having the first polarity. When the button is in the first button position, the button biases the magnet holder to a first magnet holder position, in which the first magnet is proximate to the first magnet sensor and the second magnet is proximate to the second magnet sensor. When the button is in the second button position, the button biases the magnet holder to a second magnet holder position, in which the second magnet is proximate to the first magnet sensor and the third magnet is proximate to the second magnet sensor. When the button is in the third button position, the button biases the magnet holder to a third magnet holder position, in which the third magnet is proximate to the first magnet sensor and the fourth magnet is proximate to the second magnet sensor.

In another embodiment, a method of operating a switch includes providing a switch having a button, a magnet holder in contact with the button, and a printed circuit board having at least a first magnet sensor and a second magnet sensor connected thereto. The method further includes moving the button to a first button position, thereby biasing the magnet holder to a first magnet position in which a first magnet is proximate to the first magnet sensor and a second magnet is proximate to the second magnet sensor. The method also includes moving the button to a second button position, thereby biasing the magnet holder to a second magnet position in which the second magnet is proximate to the first magnet sensor and a third magnet is proximate to the second magnet sensor. The method further includes moving the button to a third button position, thereby biasing the magnet holder to a third magnet position in which the third magnet is proximate to the first magnet sensor and a fourth magnet is proximate to the second magnet sensor.

In yet another embodiment, a rocker switch includes a rocker switch housing and a printed circuit board mounted to the rocker switch housing. The printed circuit board includes a first magnet sensor. The rocker switch further includes a button rotatably mounted to the rocker switch housing about a first axis. The button is moveable between a first button position and a second button position. The rocker switch also includes a magnet holder in contact with the button and rotatably mounted to the rocker switch housing about a second axis different from the first axis. The magnet holder holds a first magnet having a first polarity and a second magnet having a second polarity different from the first polarity. When the button is in the first button position, the button biases the magnet holder to a first magnet holder position, in which the first magnet is proximate to the magnet sensor. When the button is in the second button position, the button biases the magnet holder to a second magnet holder position, in which the second magnet is proximate to the magnet sensor.

BRIEF DESCRIPTION OF DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
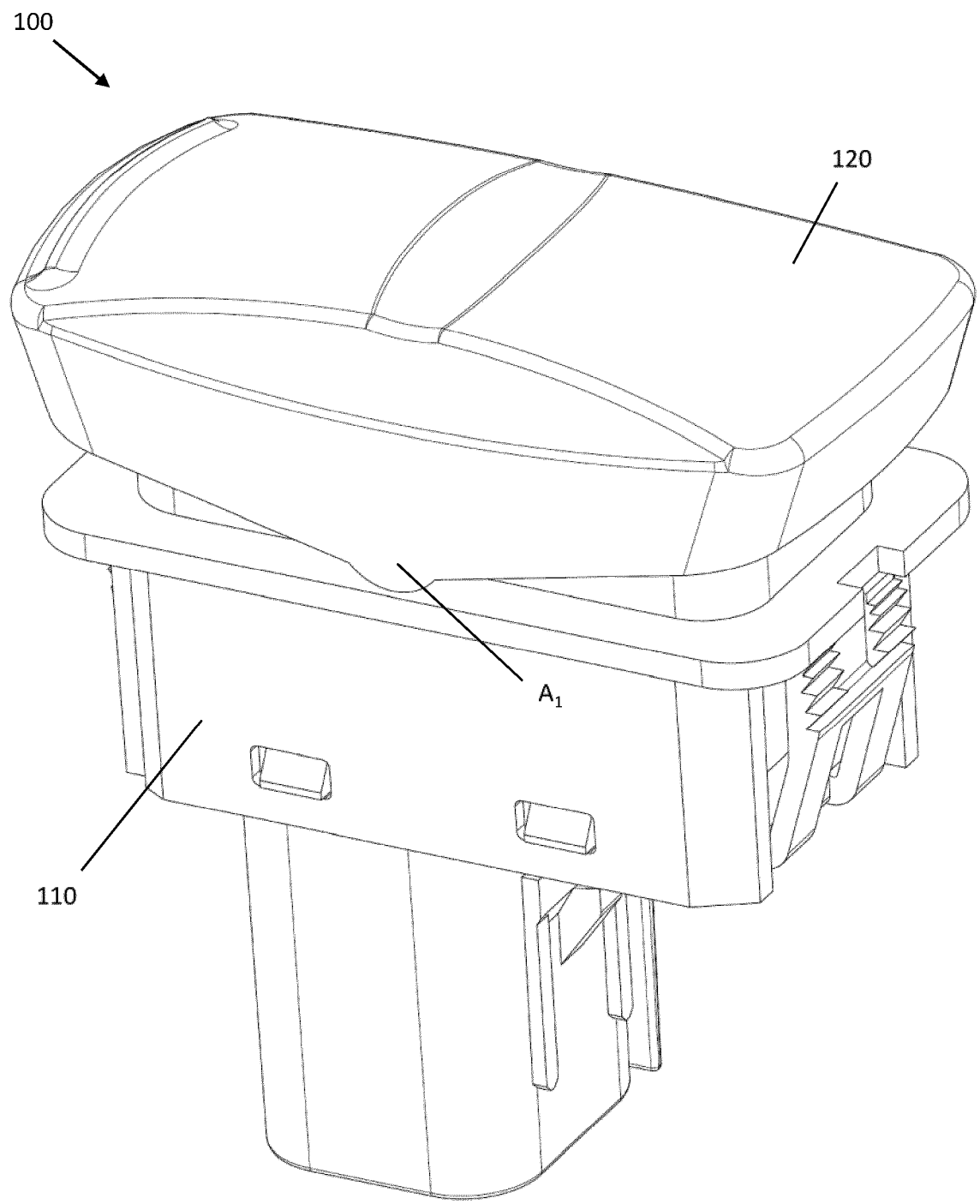
FIG. 1 is a perspective view of one embodiment of a switch 100.

FIG. 1 illustrates a perspective view of one embodiment of a switch 100. The switch 100 includes a switch housing 110. While a housing for a single switch is shown, in alternative embodiments the housing may house two or more switches. The switch housing 110 is merely exemplary and the dimensions and features may vary.

A button 120 is moveably mounted to the switch housing 110. In the illustrated embodiment, the button 120 is a rocker-type button that pivots about a button axis $A_1$. The button 120 is shown as having a convex top surface. In alternative embodiments, the button may have a flat, concave, or angled surface.

The button 120 is shown here in a neutral position and is moveable between at least three positions. For example, from this perspective the button 120 may move between a left-side down (or first) position, a neutral (or second) position that is shown here, and a right-side down (or third) position. The designation of first, second, third positions is arbitrary and is merely for explanation purposes. In an alternative embodiment, the button is moveable between two positions. In another alternative embodiment, the button is moveable between four or more positions. While the button 120 is shown and described as a rocker-type button, it should be understood that other buttons, switches, and dials may be implemented.

Figure 2:
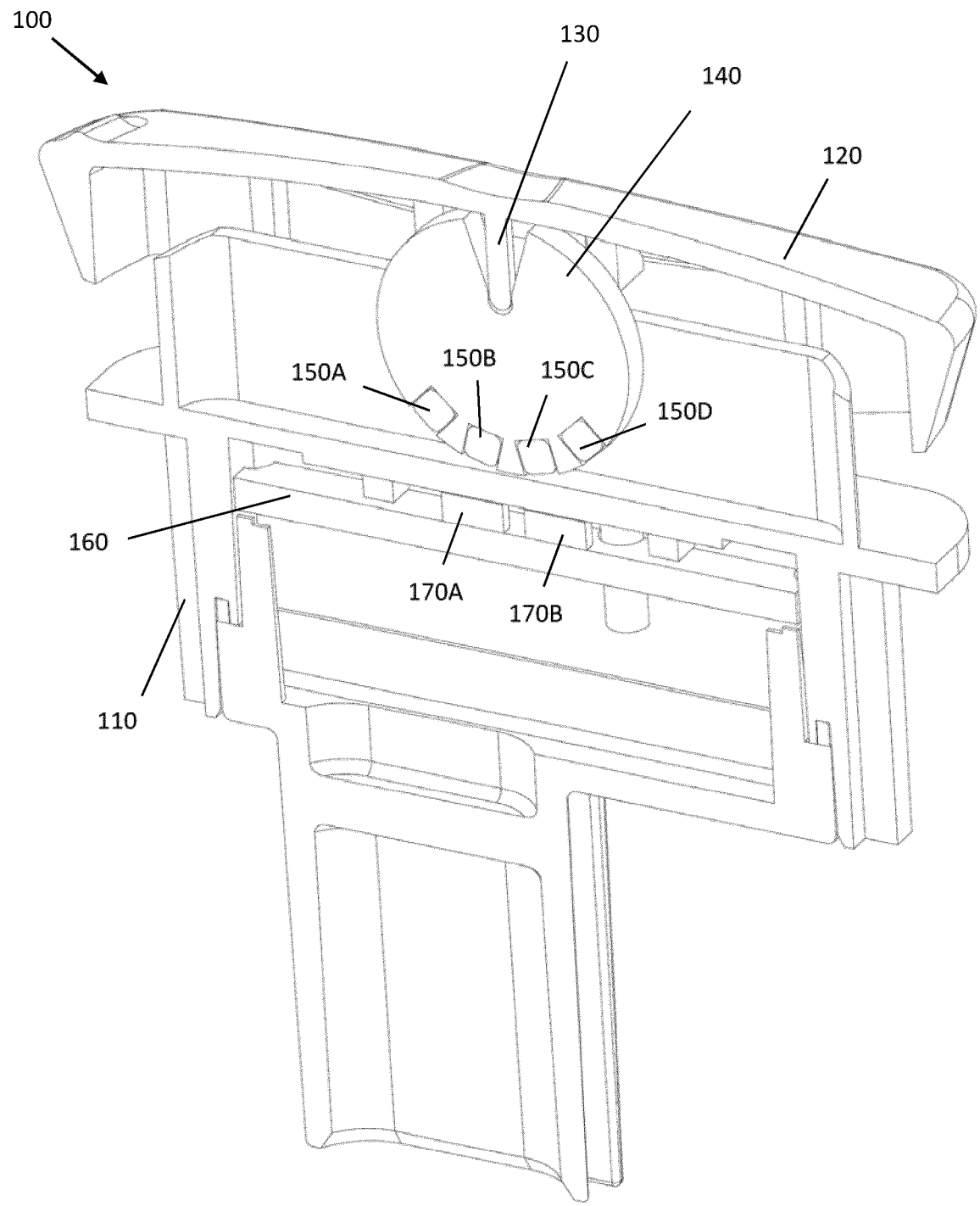
FIG. 2 is a cross-section of a perspective view of the switch 100 in a neutral position.

FIG. 2 illustrates a cross-section of a perspective view of the switch 100 in the neutral position. As can be seen in this view, the button 120 includes a lever arm 130 that engages a magnet holder 140. The magnet holder 140 is thus in contact with the button 120 and is moveably mounted to the housing 110. The lever arm 130 is a straight member received in a wedge-shaped opening of the magnet holder 140. This geometry allows the button 120 to pivot by a pre-determined distance before engaging the magnet holder 140. The opening may alternatively have any geometry, and may be symmetric or asymmetric. In alternative embodiments (not shown), the wedge-shaped opening may be replaced by a slot or the magnet holder may be affixed to the button. While the magnet holder 140 is shown as a circular disc, it should be understood that any geometry may be employed.

The magnet holder 140 includes openings that receive a first magnet 150A, a second magnet 150B, a third magnet 150C, and a fourth magnet 150D. The magnets 150A-D may be fixed in place by adhesive or other attachment means. In the illustrated embodiment, the magnets 150A-D are located opposite the wedge-shaped opening of the magnet holder 140. In other embodiments, the magnets may be located anywhere on the magnet holder.

The first magnet 150A and the fourth magnet 150D have a first polarity, and the second magnet 150B and the third magnet 150C have a second polarity different from the first polarity. For example, in one embodiment, the first and fourth magnets 150A,D have a positive polarity while the second and third magnets 150B,C have a negative polarity. In an alternative embodiment, the first and fourth magnets 150A,D have a negative polarity while the second and third magnets 150B,C have a positive polarity.

The switch 100 further includes a printed circuit board 160 mounted to the housing 110. The printed circuit board 160 includes a first magnet sensor 170A and a second magnet sensor 170B. In the illustrated embodiment, the first and second magnet sensors 170A,B are mounted directly on the printed circuit board 160 and thus are mounted linearly. In one embodiment, the magnet sensors 170A,B are spaced from the magnet holder 140 by a distance of about 2.5 mm. In an alternative embodiment, the magnet sensors 170A,B are spaced from the magnet holder 140 by any distance, depending on the strength of the magnets and sensors.

In an alternative embodiment (not shown), the magnet sensors are not directly mounted on the printed circuit board, but are in signal communication with the printed circuit board, such as through a wired connection. Such an arrangement would allow the magnet sensors to be arranged in a non-linear fashion. For example, the magnet sensors may be arranged in an arc so that they are equal distances from the magnet holder.

For illustrative purposes, all other internal components of the switch housing 110 have been omitted from this view. It should be understood, however, that the switch housing may include wires, electronics, or other mechanical or electrical components.

In FIG. 2, the button 120 is in a neutral position. Using the numbering convention above, this neutral position may be referred to as the second position. In this second position, the lever arm 130 of the button 120 is not engaged with the magnet holder 140. However, to move the button 120 into the second position from another position, the lever arm 130 biases the magnet holder 140 to the illustrated second magnet holder position, in which the second magnet 150B is proximate to the first magnet sensor 170A and the third magnet 150C is proximate to the second magnet sensor 170B.

As discussed above, the second magnet 150B and the third magnet 150C both have a second polarity. Thus, both the first magnet sensor 170A and the second magnet sensor 170B sense the second polarity. In one embodiment, the printed circuit board 160 is configured to transmit a pre-determined signal upon determining that both the first magnet sensor 170A and the second magnet sensor 170B sense the second polarity. In an alternative embodiment, the printed circuit board 160 is configured to transmit no signal upon determining that both the first magnet sensor 170A and the second magnet sensor 170B sense the second polarity.

Figure 3:
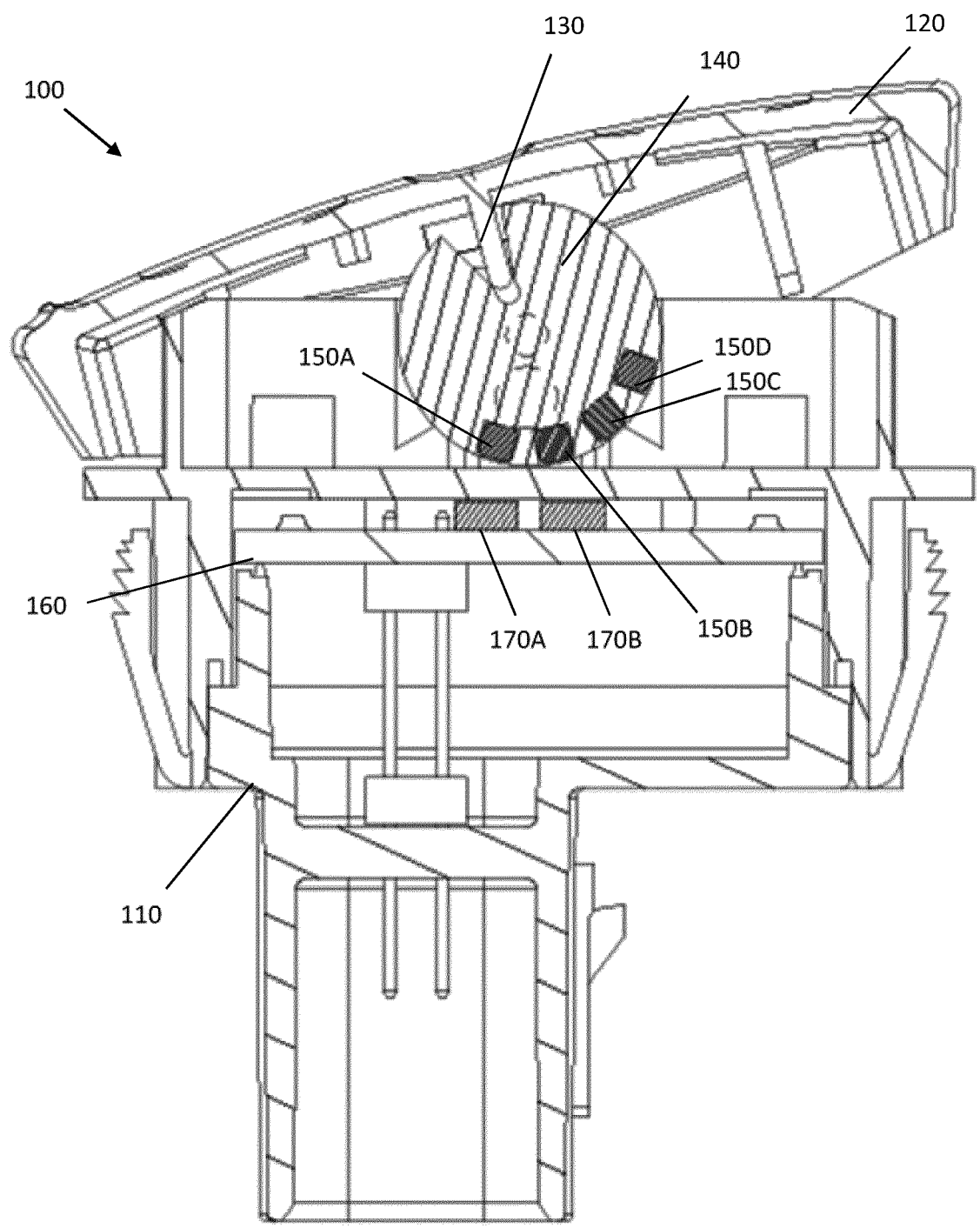
FIG. 3 is a cross-section of a front view of the switch 100 in a first position.

FIG. 3 illustrates a cross-section of a front view of the switch 100 in a first position. In the first position, the button 120 is in a left-side down position. In the illustrated embodiment, the button 120 is rotated about 15° counterclockwise from the neutral position. In alternative embodiments, an angular distance between the first button position and the second button position is between 10° and 20°. In other alternative embodiments, the first and second button positions may be separated by any angular distance. To move the button 120 into the first position from another position, the lever arm 130 biases the magnet holder 140 to the illustrated first magnet holder position, in which the first magnet 150A is proximate to the first magnet sensor 170A and the second magnet 150B is proximate to the second magnet sensor 170B. The magnet holder 140 rotates about 30° from the neutral position to the first position. In an alternative embodiment, an angular distance between the first magnet position and the neutral magnet position is between 20° and 40°. In other alternative embodiments, the first and second magnet positions may be separated by any angular distance. The button 120 and magnet holder 140 may rotate different amounts due to the wedge-shaped opening in the magnet holder 140. The button 120 and magnet holder 140 may also rotate about different axes, which would also cause the components to rotate different amounts.

As discussed above, the first magnet 150A has the first polarity and the second magnet 150B has the second polarity. Thus, the first magnet sensor 170A senses the first polarity and the second magnet sensor 170B senses the second polarity. In one embodiment, the printed circuit board 160 is configured to transmit a pre-determined signal upon determining that the first magnet sensor 170A senses the first polarity and the second magnet sensor 170B senses the second polarity. This pre-determined signal may be different from a pre-determined signal that is sent when the magnet holder 140 is in the neutral position. In an alternative embodiment, the printed circuit board 160 is configured to transmit no signal upon determining that the first magnet sensor 170A senses the first polarity and the second magnet sensor 170B senses the second polarity.

Figure 4:
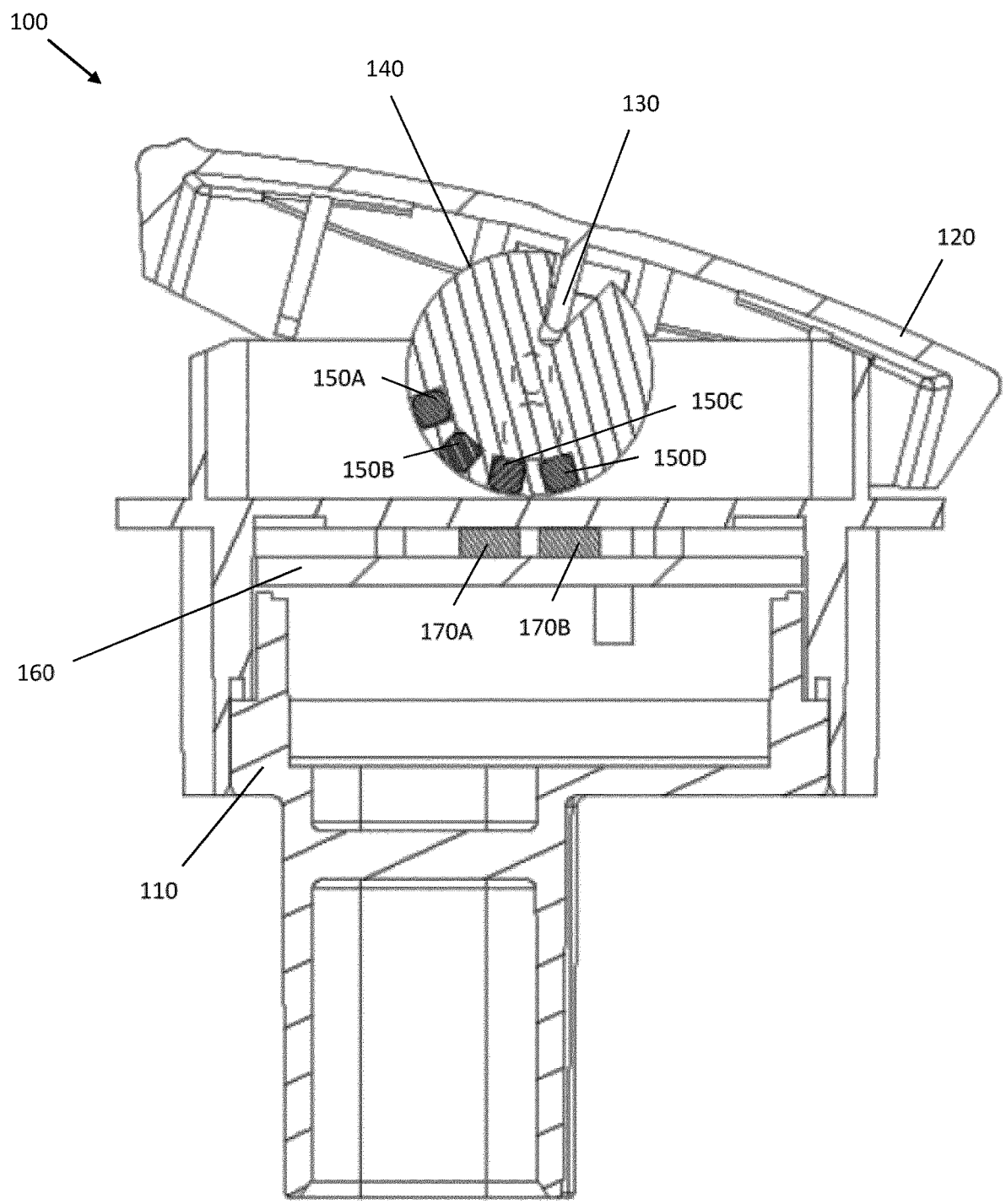
FIG. 4 is a cross-section of a front view of the switch 100 in a third position.

FIG. 4 illustrates a cross-section of a front view of the switch 100 in a third position. In the third position, the button 120 is in a right-side down position. In the illustrated embodiment, the button 120 is rotated about 15° clockwise from the neutral position. In alternative embodiments, an angular distance between the third button position and the second button position is between 10° and 20°. In other alternative embodiments, the second and third button positions may be separated by any angular distance. To move the button 120 into the third position from another position, the lever arm 130 biases the magnet holder 140 to the illustrated third magnet holder position, in which the third magnet 150C is proximate to the first magnet sensor 170A and the fourth magnet 150D is proximate to the second magnet sensor 170B. The magnet holder 140 rotates about 30° from the neutral position to the first position. In an alternative embodiment, an angular distance between the third magnet position and the neutral magnet position is between 20° and 40°. In other alternative embodiments, the second and third magnet positions may be separated by any angular distance.

As discussed above, the third magnet 150C has the second polarity and the fourth magnet 150D has the first polarity. Thus, the first magnet sensor 170A senses the second polarity and the second magnet sensor 170B senses the first polarity. In one embodiment, the printed circuit board 160 is configured to transmit a pre-determined signal upon determining that the first magnet sensor 170A senses the second polarity and the second magnet sensor 170B senses the first polarity. This pre-determined signal may be different from a pre-determined signal that is sent when the magnet holder 140 is in the first position or in the neutral position. In an alternative embodiment, the printed circuit board 160 is configured to transmit no signal upon determining that the first magnet sensor 170A senses the second polarity and the second magnet sensor 170B senses the first polarity.

Figure 5:
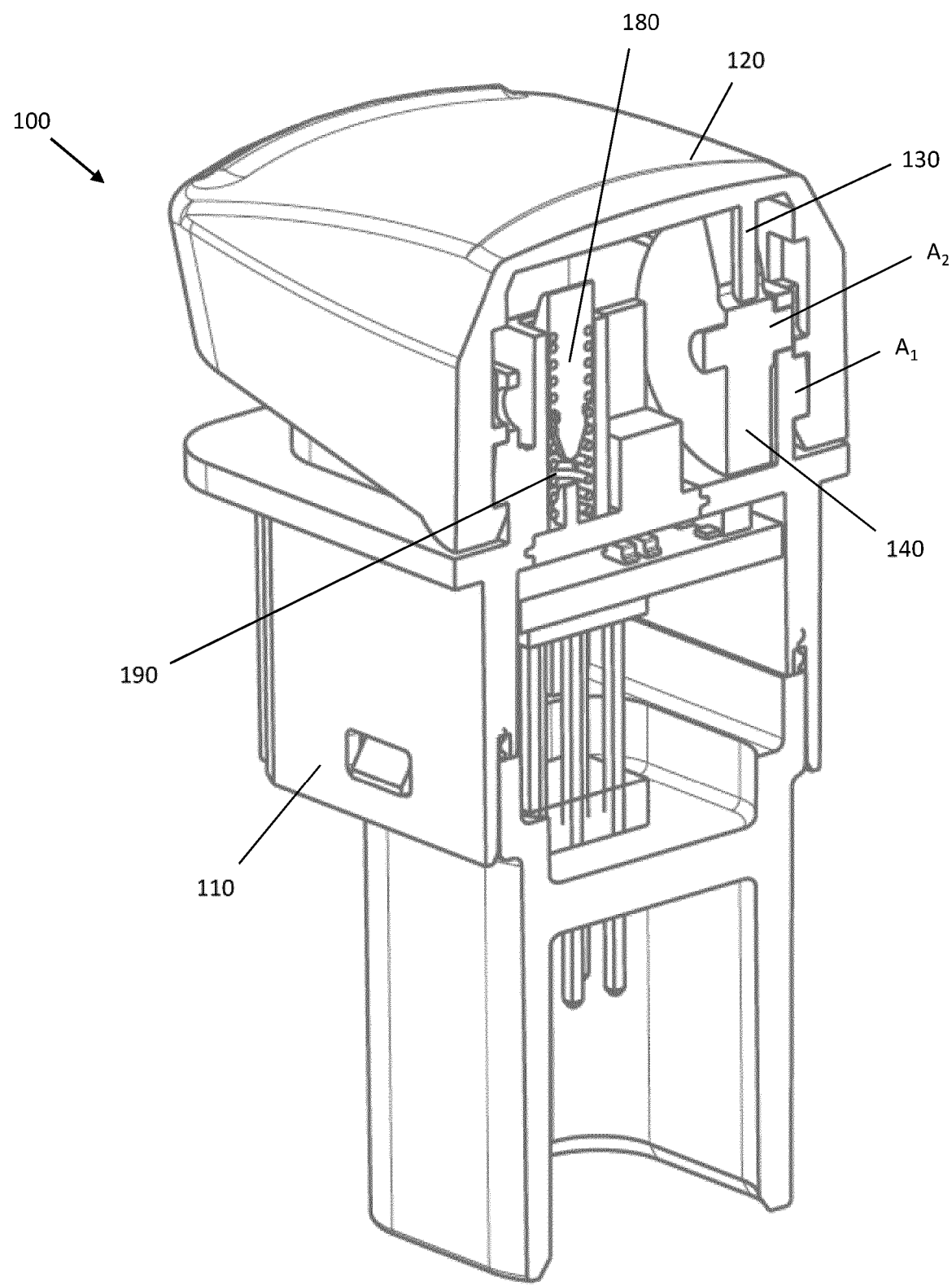
FIG. 5 is another cross-section of a perspective view of the switch 100 in a neutral position.

FIG. 5 illustrates another cross-section of a perspective view of the switch 100 in a neutral position. As can be seen in this view, the button 120 is moveable about a first axis $A_1$ and the magnet holder 140 is moveable about a second axis $A_2$. The axes are offset by a distance of about 2.5 mm to 3.0 mm. In an alternative embodiment (not shown), the button and the magnet holder can be offset by any distance. In another alternative embodiment (not shown), the button and the magnet holder rotate about the same axis.

In the illustrated embodiment, the switch housing 110 further houses a plunger 180 that is biased upwards by a spring 190. The plunger 180 and spring 190 may lock the button 120 into one of the first, second, and third button positions. It should be understood that other biasing or locking members may be employed, such as torsion springs or elastomeric members. In some embodiments, it may be desirable for the button to remain in place after being moved to the first, second, or third position. In other embodiments, it may be desirable for the button to be biased back towards a neutral position after being moved to the first or third position.

Figure 6:
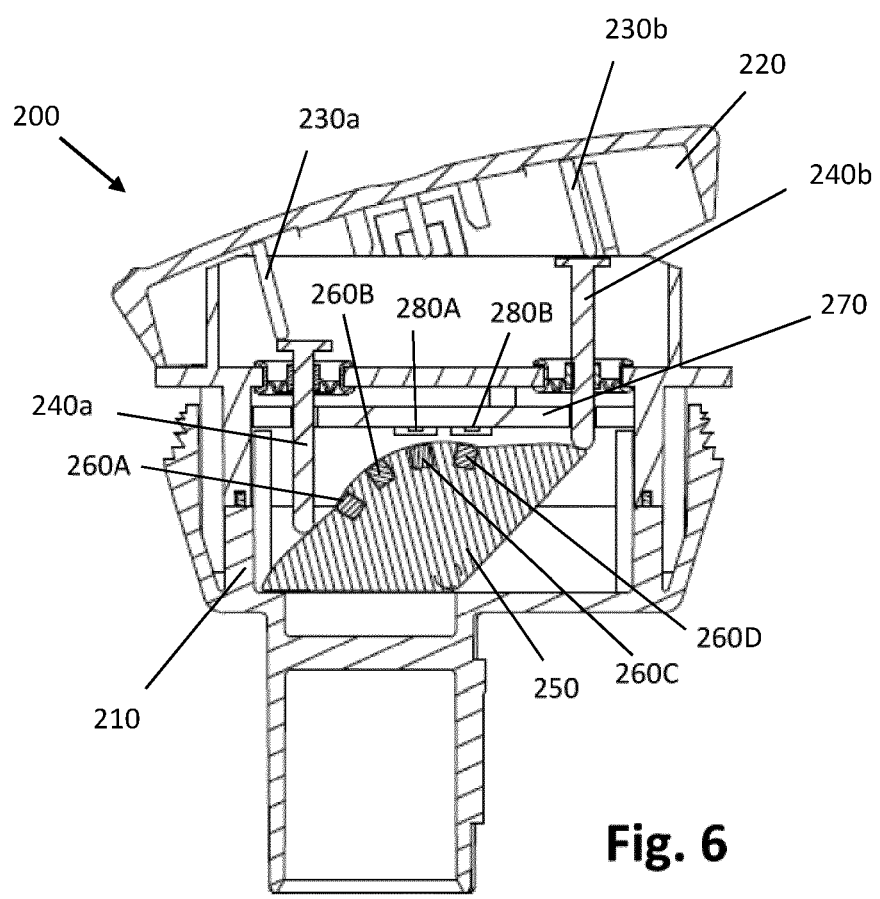
FIG. 6 is a cross-section of a front view of an alternative embodiment of a switch 200 in a first position.
Figure 7:
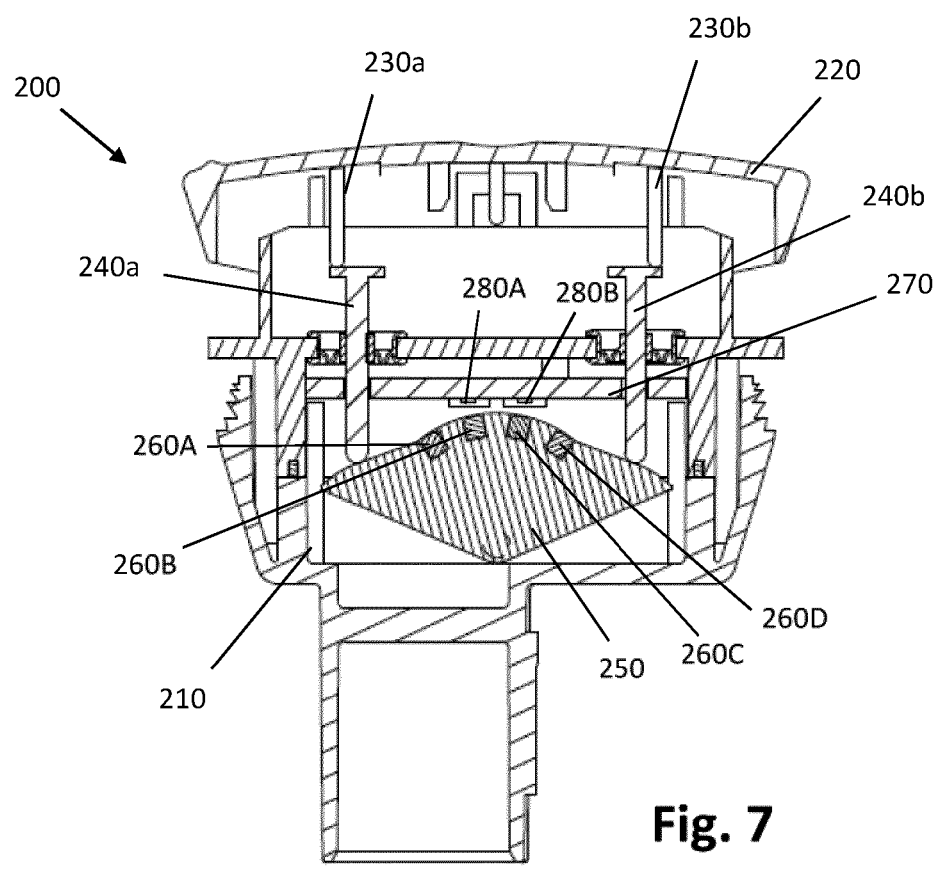
FIG. 7 is a cross-section of a front view of the switch 200 in a second position.
Figure 8:
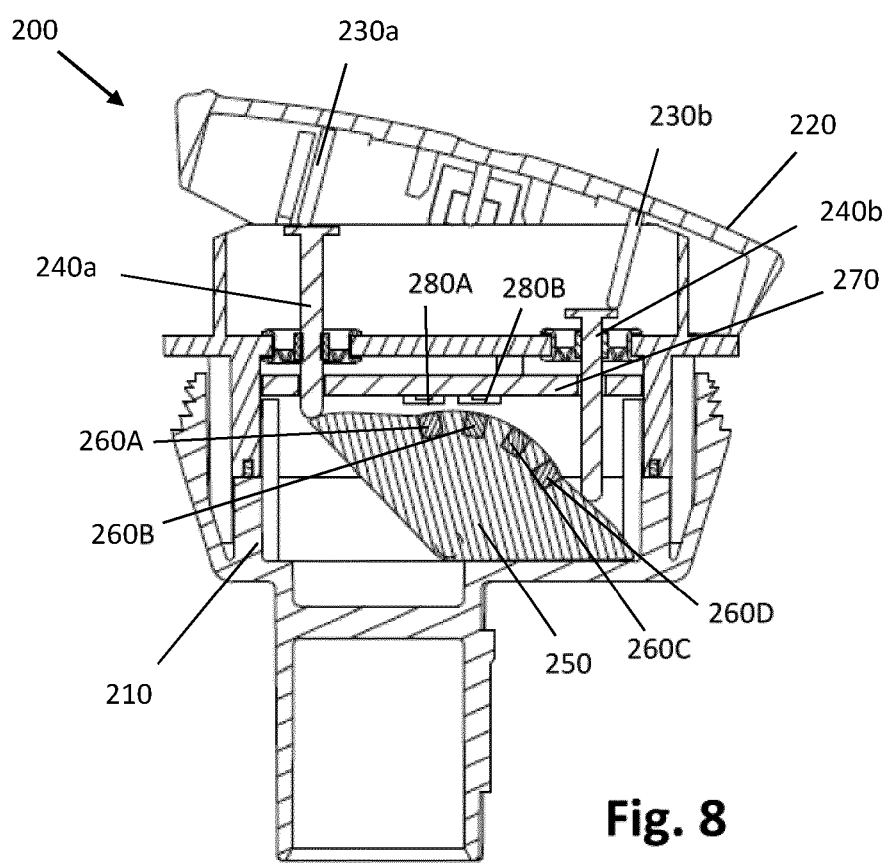
FIG. 8 is a cross-section of a front view of the switch 200 in a third position.

FIGS. 6-8 illustrate an alternative embodiment of a switch 200. The switch 200 is substantially the same as the switch 100 except for the differences described herein. It should be understood that the alternative embodiments described above with respect to the switch 100 may also apply to the switch 200.

FIG. 6 is a cross-section of a front view of the switch 200 in a first position. The switch 200 includes a switch housing 210 with a button 220 moveably mounted thereto. The button 220 is shown here in a first, left-side down position and is moveable between at least three positions. The button 220 includes a first lever arm 230a that engages a first pushrod 240a and a second lever arm 230b that engages a second pushrod 240b. The first pushrod 230a likewise engages with a first side of a magnet holder 250 and the second pushrod 230b engages with a second side of the magnet holder 250. The magnet holder 250 is thus indirectly in contact with the button 220 and is moveably mounted to the housing 110. The lengths of the pushrods 240a,b allow the magnet holder 250 to be mounted at a location spaced from the button 220. In the illustrated embodiment, the lever arms 230a,b and pushrods 240a,b are straight members and the magnet holder 250 is wedge-shaped, with one side defined by multiple radii. Other geometries may be employed, however.

The magnet holder 250 includes openings that receive a first magnet 260A, a second magnet 260B, a third magnet 260C, and a fourth magnet 260D. The magnets 260A-D may be fixed in place by adhesive or other attachment means. The first magnet 260A and the fourth magnet 260D have a first polarity, and the second magnet 260B and the third magnet 260C have a second polarity different from the first polarity. For example, in one embodiment, the first and fourth magnets 260A,D have a positive polarity while the second and third magnets 260B,C have a negative polarity. In an alternative embodiment, the first and fourth magnets 260A,D have a negative polarity while the second and third magnets 260B,C have a positive polarity.

The switch 200 further includes a printed circuit board 270 mounted to the housing 210. In this embodiment, the printed circuit board 270 is located above the magnet holder 250. The printed circuit board 270 includes a first magnet sensor 280A and a second magnet sensor 280B. In the illustrated embodiment, the first and second magnet sensors 280A,B are mounted directly on the printed circuit board 270 and thus are mounted linearly.

In FIG. 6, the button 220 is in the first, left-side down position. In this position, the first lever arm 230a of the button 220 biases the first pushrod 240a downward, which in turn pushes the left side of the magnet holder 250 downward. When the magnet holder is in this position, the third magnet 260C is proximate to the first magnet sensor 280A and the fourth magnet 260D is proximate to the second magnet sensor 280B.

FIG. 7 is a cross-section of a front view of the switch 200 in a second, neutral position. In this position, the lever arms 230a,b, pushrods 240a,b and magnet holder 250 are all in a neutral position. When the magnet holder is in this position, the second magnet 260B is proximate to the first magnet sensor 280A and the third magnet 260C is proximate to the second magnet sensor 280B.

FIG. 8 is a cross-section of a front view of the switch 200 in a third, right-side down position. In this position, the second lever arm 230b of the button 220 biases the second pushrod 240b downward, which in turn pushes the right side of the magnet holder 250 downward. When the magnet holder is in this position, the first magnet 260A is proximate to the first magnet sensor 280A and the second magnet 260B is proximate to the second magnet sensor 280B.

While two examples of three-position buttons have been shown and described, it should be understood that the principles discussed may be applied to a two-position button. In such an embodiment, the magnet holder would include two magnets one with a first polarity and one with a second polarity. The switch housing would include a single magnet sensor. When the button is in a first position, the first magnet would be proximate to the single magnet sensor. When the button is in a second position, the second magnet would be proximate to the single magnet sensor.

Likewise, the principles discussed may be applied to a four-position button. In such an embodiment, the magnet holder would include six magnets. In one example, the first, second, and third magnets have a first polarity and the fourth, fifth, and sixth magnets have a second polarity. However, other permutations may be employed. The switch housing would include three magnet sensors. When the button is in a first position, the first magnet would be proximate to the first magnet sensor, the second magnet would be proximate to the second magnet sensor, and the third magnet would be proximate to the third magnet sensor. When the button is in a second position, the second magnet would be proximate to the first magnet sensor, the third magnet would be proximate to the second magnet sensor, and the fourth magnet would be proximate to the third magnet sensor. When the button is in a third position, the third magnet would be proximate to the first magnet sensor, the fourth magnet would be proximate to the second magnet sensor, and the fifth magnet would be proximate to the third magnet sensor. When the button is in a fourth position, the fourth magnet would be proximate to the first magnet sensor, the fifth magnet would be proximate to the second magnet sensor, and the sixth magnet would be proximate to the third magnet sensor.

In other embodiments, the button may be moveable between n different positions. The housing would house n−1 magnet sensors that detect 2×(n−1) magnets disposed on a magnet sensor.

Additionally, while the above embodiments describe moving magnets and stationary magnet sensors, in alternative embodiments, the magnet sensors may move relative to stationary magnets. In such an embodiment, the button would engage a magnet sensor holder, rather than a magnet holder.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the application, in its broader aspects, is not limited to the specific details, the representative apparatus and method, and illustrative examples shown and described. Accordingly, departures may be made from such details without departing from the spirit or scope of the applicant's general inventive concept.

What is claimed is:

1. A switch comprising:
a switch housing;
a printed circuit board mounted to the switch housing and including at least a first magnet sensor and a second magnet sensor;
a button moveably mounted to the switch housing, the button being moveable between at least a first button position, a second button position, and a third button position;
a magnet holder in contact with the button and moveably mounted to the switch housing,
wherein the magnet holder holds at least a first magnet having a first polarity, a second magnet having a second polarity different from the first polarity, a third magnet having the second polarity, and a fourth magnet having the first polarity,
wherein when the button is in the first button position, the button biases the magnet holder to a first magnet holder position, in which the first magnet is positioned to activate the first magnet sensor and the second magnet is positioned to activate the second magnet sensor,
wherein when the button is in the second button position, the button biases the magnet holder to a second magnet holder position, in which the second magnet is positioned to activate the first magnet sensor and the third magnet is positioned to activate the second magnet sensor,
wherein when the button is in the third button position, the button biases the magnet holder to a third magnet holder position, in which the third magnet is positioned to activate the first magnet sensor and the fourth magnet is positioned to activate the second magnet sensor.

2. The switch of claim 1, wherein the button is moveable about a first axis and the magnet holder is moveable about a second axis.

3. The switch of claim 2, wherein the first axis is different from the second axis.

4. The switch of claim 1, wherein the first polarity is a negative polarity and the second polarity is a positive polarity.

5. The switch of claim 1, wherein the second button position is between the first button position and the third button position.

6. The switch of claim 5, wherein an angular distance between the first button position and the second button position is between 10° and 20°, and wherein an angular distance between the second button position and the third button position is between 10° and 20°.

7. The switch of claim 1, wherein the second magnet is between the first magnet and the third magnet.

8. The switch of claim 7, wherein the third magnet is between the second magnet and the fourth magnet.

9. The switch of claim 8, wherein an angular distance between the first magnet and the second magnet is between 20° and 40°, wherein an angular distance between the second magnet and the third magnet is between 20° and 40°, and wherein an angular distance between the third magnet and the fourth magnet is between 20° and 40°.

10. A method of operating a switch, the method comprising:
providing a switch having a button, a magnet holder in contact with the button, and a printed circuit board having at least a first magnet sensor and a second magnet sensor connected thereto;
moving the button to a first button position, thereby biasing the magnet holder to a first magnet position in which a first magnet is adjacent to the first magnet sensor and a second magnet is adjacent to the second magnet sensor;
moving the button to a second button position, thereby biasing the magnet holder to a second magnet position in which the second magnet is adjacent to the first magnet sensor and a third magnet is adjacent to the second magnet sensor; and
moving the button to a third button position, thereby biasing the magnet holder to a third magnet position in which the third magnet is adjacent to the first magnet sensor and a fourth magnet is adjacent to the second magnet sensor.

11. The method of claim 10, wherein the step of moving the button to the first button position includes tilting the button between 10° and 20° in a first direction from a neutral position.

12. The method of claim 11, wherein the step of moving the button to the second button position includes moving the button to the neutral position.

13. The method of claim 12, wherein the step of moving the button to the third button position includes tilting the button between 10° and 20° in a second direction from the neutral position.

14. The method of claim 10, wherein upon determining that the first magnet is adjacent to the first magnet sensor and the second magnet is adjacent to the second magnet sensor, the printed circuit board transmits a first signal, and wherein upon determining that the third magnet is adjacent to the first magnet sensor and a fourth magnet is adjacent to the second magnet sensor, the printed circuit board transmits a second signal different from the first signal.

15. The method of claim 14, wherein upon determining that the second magnet is adjacent to the first magnet sensor and the third magnet is adjacent to the second magnet sensor, the printed circuit board transmits a third signal different from the first signal and different from the second signal.

16. A rocker switch comprising:
a rocker switch housing;
a printed circuit board mounted to the rocker switch housing and including a first magnet sensor and a second magnet sensor;
a button rotatably mounted to the rocker switch housing about a first axis, the button being moveable between a first button position and a second button position;
a magnet holder in contact with the button and rotatably mounted to the rocker switch housing about a second axis different from the first axis,
wherein the magnet holder holds a first magnet having a first polarity, a second magnet having a second polarity different from the first polarity, a third magnet having the second polarity, and a fourth magnet having the first polarity,
wherein when the button is in the first button position, the button biases the magnet holder to a first magnet holder position, in which the first magnet is adjacent to the first magnet sensor, and the second magnet is adjacent to the second magnet sensor, and
wherein when the button is in the second button position, the button biases the magnet holder to a second magnet holder position, in which the second magnet is adjacent to the first magnet sensor, and the third magnet is adjacent to the second magnet sensor.

17. The rocker switch of claim 16, wherein the button is further moveable to a third button position.

18. The rocker switch of claim 17, wherein when the button is in the third button position, the button biases the magnet holder to a third magnet holder position, in which the third magnet is adjacent to the magnet sensor and the fourth magnet is adjacent to the second magnet sensor.

\* \* \* \* \*